United States Patent [19]

Andrascek et al.

[11] 4,046,620

[45] Sept. 6, 1977

[54] PROCESS FOR IMPROVING THE SOLDERABILITY OF ELECTRIC CIRCUIT BOARDS

[75] Inventors: Ernst Andrascek; Hans Hadersbeck, both of Munich, Germany

[73] Assignee: Siemens Aktiengesellschaft, Berlin & Munich, Germany

[21] Appl. No.: 703,373

[22] Filed: July 8, 1976

[30] Foreign Application Priority Data

July 11, 1975 Germany ............................ 2531163

[51] Int. Cl.² ............................ C23F 1/00; B44C 1/22
[52] U.S. Cl. .................................. 156/666; 156/651; 156/901; 134/3; 134/41; 252/79.1; 252/79.2; 252/79.4; 427/96; 427/309; 427/327

[58] Field of Search ................ 156/18, 666, 651, 901; 427/96, 327, 309; 252/79.1, 79.2, 79.4; 134/3, 41

[56] References Cited

U.S. PATENT DOCUMENTS

| | | | |
|---|---|---|---|
| 3,020,175 | 2/1962 | Penczek | 427/96 |
| 3,367,875 | 2/1968 | Sherer | 252/79.4 |
| 3,887,405 | 6/1975 | Fong | 156/18 |

*Primary Examiner*—Michael F. Esposito
*Attorney, Agent, or Firm*—Hill, Gross, Simpson, Van Santen, Steadman, Chiara & Simpson

[57] ABSTRACT

A process is provided for improving the solderability of electric circuit boards with conductor paths composed of copper or copper alloys, in which, at least at the locations to be soldered, the conductor paths are cleansed in a first solution and are thereby deoxidized, and are then activated in a second solution.

8 Claims, No Drawings

PROCESS FOR IMPROVING THE SOLDERABILITY OF ELECTRIC CIRCUIT BOARDS

BACKGROUND OF THE INVENTION

Following the completion of circuit boards provided with conductor paths consisting of copper or copper alloys, residues and impurities resultant from the production give rise to difficulties regarding the solderability of the conductor paths which are further increased as a result of a long storage of the circuit boards. Experience has shown that the best remedy regarding soldering faults is provided by a careful and suitable cleansing of the circuit boards and the subsequent application of a soldering agent. To this end, the surfaces of the conductor paths can be freed of impurities mechanically by sand-blasting scouring, grinding, buffing, brushing and even by erasing with a special rubber. However, in these mechanical cleansing processes, it is difficult to control the extend of the removal of metal from the surface of the conductor paths. In addition, particles of the grinding agents which are employed and also of the abraded material can settle at points to which it is difficult to gain access and can impair a subsequent soldering.

For this reason generally, chemical cleansing processes are given preference. Thus, the U.S. Pat. No. 3,020,175 discloses a chemical cleansing process for electric circuit boards in which the surfaces of the conductor path is are freed of dirt and oxides in a first acid oxidizing solution, for example, a mixture of chromic acid and sulphuric acid. Subsequently, the surface of the conductor paths is activated, i.e. brought into a condition of good solderability, in a second solution, for example, dilute hydrochloric acid. In this second solution salt films, such as, for example, chromate films which have formed during the treatment in the first solution, are completely removed. The improvement in solderability which is achieved with this chemical cleansing process reduces considerably, however, with increasing length of storage of circuit boards after such a treatment. Furthermore, the baths employed in chemical cleansing processes not only require expensive servicing, but also are generally very agressive and complicated to prepare in respect of environmental waste disposal technology.

BRIEF SUMMARY OF THE INVENTION

Thus, a primary aim of this invention is to provide a surface treatment process for circuit boards which ensures a good and longer lasting solderability of the circuit boards and which does not exhibit any problems regarding environmental waste disposal.

For the realisation of this aim, the invention proposes a two solution circuit board contacting process in which an aqueous solution of non-ionic surfactant and an organic acid is used as a first solution, and an aqueous solution of potassium persulfate (potassium peroxydisulfate) and an acid is used as second solution.

Other and further aims, purposes, advantages, features, uses and the like will be apparent to those skilled in the art from the present specification.

DETAILED DESCRIPTION

Surfactants are to be understood as water-soluble compounds active at bundary surfaces, a molecule of which possesses at least one hydrophilic component and a hydrophobic remainder. In non-ionic surfactants, the hydrophilic component of the molecule is the location of an electro-neutral group. In non-ionic surfactants, the hydrophilic component of the surfactant molecule is achieved either through the presence of oxygen in the molecule (as in ethylene oxide or propylene oxide hydrophylic linkages, terminal hydroxyl groups, or oxygen linked directly to nitrogen as in amide groups) or via sulfonate, phosphate, or carboxylate terminal groups in the case of zwitterionics. The hydrophobic component of a non-ionic surfactant molecule comprises hydrocarbon chains which can be linked to such a hydrophilic component via aliphatic or aromatic ring systems.

The combined treatment of circuits boards with two solutions as taught by this invention surprisingly achieves an extremely effective increase in the solderability of conductor paths. The result achieved is considerably better than the improvement in solderability facilitated by previously known processes. The treatment process of this invention is also suitable to reactivate circuit board surfaces which no longer possess solderability.

A further advantage consists in that both solutions can easily be removed from the point of view of environmental waste disposal technology after a long period of use. Thus, by means of a simple follow-up treatment, the two solutions can be converted into a clear solution which is harmless to the environment and which can be pumped into a waste system.

Preferably, in accord with the teachings of this invention, a first solution contains a non-ionic surfactant of the ethoxylated type. Ethoxylated surfactants are formed by condensing ethylene oxide to form polyether chains using the so-called ethoxylation reaction. If this reaction occurs with a substance which possesses hydrogen atoms which are capable of reacting, for examples, with a fatty acid or a phenol, in the presence of either acidic or basic catalysis, polyether chains develop whose end groups are hydroxyl groups, for example:

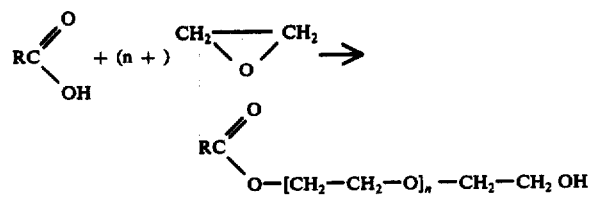

In ethoxylation, compounds such as, for examples, fatty acids, aliphatic alcohols, faty amines, fatty acid amides, alkyl substituted phenols and other phenol homologs, aliphatic mercaptans, terpene alcohols, or the like, are reacted with ethylene oxide. For purposes of the present invention, one commences with compounds which contain from about 10 to 18 carbon atoms per molecule in the form of hydrophobic chains. Sufficient ethylene oxide is condensed per molecule therewith to achieve a "degreee of ethoxylation" corresponding to from about 2 to 40 Moles ethylene oxide. The degree of ethoxylation does not define a clear chain length since, as with all polymers, actual chain length in a given product is statistically distributed about a mean value. Examples of suitable non-ionic ethoxylated surfactants include alkyl ethoxylates, ethoxylated alkyl phenols, fatty acid ethanol amides, polymers of ethylene oxide, propylene oxide, and alcohols, and the like, all having incorporated thereinto from about 2 to 40 moles of ethylene oxide per molecule.

Advantageously, a first solution with ethoxylated alkyl phenol is used as the non-ionic surfactant. When, for example, an aqueous solution comprising from about 20 to 100 grams of ethoxylated alkyl phenol per liter and from about 15 to 80 grams of an organic acid per liter is used as the first solution, an excellent cleansing and a reliable deoxidation of conductor paths on circuit boards is ensured in a first treatment stage of the process of the invention. The first solution is preferably adjusted with such organic acid so as to have a pH of about 2.

The use of a second solution saturated with potassium persulfate has proven to be particularly advantageous. Preferably, such a second solution is adjusted to have a pH-value of between about 2.0 and 4.0 by the addition of sulphuric acid, and thereafter preferably such solution is stabilized against decomposition with concentrated phosphoric acid. The amount of phosphoric so added in solution form ranges from about 0.1 to 0.5 grams per liter. The circuit board surfaces activated with a second solution of this type are characteristically light in color and possess a uniform smoothness, and during subsequent soldering display excellent wetting characteristics with a uniform solder distribution.

In a preferred exemplary embodiment of the process of the invention, the surface of a circuit board with conductor paths is submerged into such a first solution, and the resulting such surface with its conductor paths is flushed with tap water. Next, such flushed surface is contacted with such a second solution, and then it is again flushed with tap water. Next, such flushed surface is again submerged into such a first solution, and, thereafter, it is once again flushed with tap water before being finally dried in the air.

Thus, to improve the solderability of a circuit board with conductors composed of a copper or copper alloys, in accordance with this invention, one first contacts with a first solution (preferably by immersion of the circuit board to be treated) conductor paths on such a board at least in areas thereof to be soldered. Contact time typically ranges from about 1 to 5 minutes, though longer and shorter contact times may be used.

The first solution used in such a contacting preferably comprises on a 100 weight percent total weight basis from about 2 to 20 weight percent of at least one dissolved non-ionic surfactant, from about 1 to 20 weight percent of at least one dissolved organic acid capable of producing a pH of not larger than 2 in water solution at a concentration of less than 50 grams per liter, and the balance up to 100 weight percent of any given first solution being water.

After such a first contacting, the so-contacted areas are flushed with water (typically tap water may be used) for a period of time of at least about 10 seconds.

Next, one contacts the so first flushed areas with a second solution. Typical contact times here range from about 2 to 10 minutes, though longer and shorter contact times may be employed.

The second solution employed for such a second contacting preferably comprises on a 100 weight percent total weight basis from about 0.5 weight percent up to solution saturation of dissolved potassium persulfate, sufficient added sulfuric acid to produce in any given such solution a pH of from about 1 to 4, from and including 0 up to about 0.5 weight percent of dissolved phosphoric acid, and the balance up to 100 weight percent of any given such second solution being water.

After such a second contacting, the so contacted area are again flushed with water (typically tap water may be used) for a period of time of at least about 10 seconds.

Thereafter, one contacts the so flushed areas with a first solution. Contacting times range from about 1 to 50 minutes. The first solution employed here can be the same first solution as used for a first contacting as above described, or such can be a different first solution having a composition as above described.

Then, the resulting contacted areas are given a final water flushing (typically tap water may be employed). A typical flushing operation involves at least about 10 seconds.

Finally, the resulting so flushed areas are dried in air.

A preferred class of such organic acids comprises lower alkanoic acids (e.g. those containing less than seven carbon atoms per molecule). A more preferred such acid comprises formic acid.

With the method of treatment of this invention, a particularly long-lasting improvement in circuit board surface solderability is achieved. If the surfaces of the so processed conductor paths are additionally coated with a conventional soldering agent, a reliable solderability of such conductor paths is ensured even after one year of storage.

In order to achieve optimum results, it is necessary to monitor the solutions employed. The first solution charcteristically has a practically unlimited life. However, it is advisable to monitor the density and the pH value of the first solution at intervals. Deviations from starting density can be corrected with addition of an aqueous concentrate of surfactant and/or organic acid. Evaporation losses are compensated for by adding tap water to a first solution. If after a long period of use, considerable clouding of a first solution through build-up therein of particles of dirt may be noticed, and, if so, it is advisable to discard the preparation.

As a result of contact with the conductor paths composed of copper or copper alloys in circuit boards, a second solution is gradually consumed until a maximum copper absorption for a given second solution is achieved. Second solution density increases through contact with circuit boards to some maximum value which is dependent upon the particular second solution employed. Thus, the second solution loses its effectiveness. The bath monitoring of the second solution consists simply in checking the density and the pH value at intervals. Evaporation losses in a second solution are compensated for by adding tap water thereto. Second solution pH value tends to rise through use, and this is compensated for by adding small amounts of diluted sulfuric acid thereto.

The elimination of the first and second solutions using environmental waste disposal technology is effected by emptying the spent solutions or baths into a concentrate container of a waste water plant effluent system and then neutralizing such with caustic potash and/or caustic soda. The released copper ions are then precipitated as copper hydroxide by which the majority of the surfactants is absorbed. The surfactants and the formic acid are oxidized by the peroxide to form carbon dioxide.

The neutral solution obtained in this way can now be harmlessly pumped via a filter assembly into waste effluent as a waterclear potassium sulphate solution which presents no danger to the environment, and is biologically useful.

EMBODIMENTS

The present invention is further illustrated by reference to the following examples. Those skilled in the art will appreciate that other and further embodiments are obvious and within the spirit and scope of this invention from the teachings of these present examples taken with the accompanying specification.

EXAMPLE

Following their production, circuit boards are submerged into a first solution for a length of time between about 1 an 3 minutes, and are subsequently slowly withdrawn therefrom in order to keep the discharge of adhering liquid small. The temperature of the first solution, which characteristically depends upon the pollution associated with the circuit boards, generally corresponds approximately to room temperature. The first solution here comprises one liter of tap water in which is dissolved both 25 grams of ethoxylated alkyl phenol with a degree of ethoxylation of from about 8 to 14 and 20 grams of 100% formic acid.

Following a flushing treatment of about 12 seconds duration in room temperature tap water, the circuit boards are submerged into a second solution. The surfaces of the circuit boards are then activated in this second solution at room temperature without moving or agitation of the system. The period of dwell of the circuit boards in this second solution amounts to about 5 minutes. The second solution is prepared by dissolving potassium persulfate salt at the rate of 54 grams per liter of tap water at a water temperature of 20° C followed by adding thereto about 10% sulphuric acid. The quantity of sulphuric acid so added is sufficient to produce in the resulting solution a pH value of 2. For the purposes of stabilization, 0.5 gram per liter of concentrated orthophosphoric acid ($H_3PO_4$) is added to the preparation.

Following removal from this second solution, the circuit boards are subjected to another such flushing treatment of about 12 seconds in tap water. Then, the circuit boards are again for a period of about 1 minute submerged into the first solution (or alternatively, into a solution corresponding to the first solution in composition), and then, as before, the circuit boards are slowly withdrawn in order to keep the loss as slight as possible.

Following a new flushing treatment in tap water, lasting about 12 seconds, the circuit boards are then dried with the aid of oil-free compressed air.

Thereafter, the dried boards are provided with a 7 to 10 micron thick coating of a soldering agent. The soldering agent can be applied by dipping, spraying, or rolling-on. Suitable soldering agents, for examples, are colophony, soldering lacquers, or the like. When the soldering agent has been dried first in air, and then in a fresh-air circulating furnace at a temperature of about 60° C, the resulting circuit boards can then be stored.

The solutions employed are monitored. The first solution is found to have a practically unlimited life. The first solution appears to have an optimum starting density of about 1,004 $g/cm^3$ and 0.7°Be (degree-Baume and an optimum pH value of 2. Deviations are corrected by addition of fresh solution, or by addition of concentrated formic acid. Evaporation losses are compensated for by adding tap water to the first solution. After a long period of use, considerable clouding of the first solution through particles is noticed, and this used solution is discarded.

When freshly made, the second solution possesses a starting density of 1.033 $g/cm^3$ of 4.9°Be and a pH value 2. As a result of contact with the conductor paths composed of copper or copper alloys in circuit boards, such solution is gradually consumed until a maximum copper absorption of 12 g/l and a corresponding density of the solution of 1.057 $g/cm^3$ of 7.9°Be is observed. Thus, the second solution loses its effectiveness. The bath monitoring of the second solution consists in checking the density and the pH value at intervals. Evaporation losses are compensated by supplying tap water to such second solution. The pH value of such second solution is correct by adding thereto small quantities of diluted sulphuric acid. To ensure sufficient reliability of this second solution for the activation of circuit boards, this second solution is discarded when its density reaches a value of 1.054 $g/cm^3$ or 7.5°Be.

The spent first and second solutions are emptied into a container and neutralized with caustic potash and/or caustic soda.

The neutral solution so obtained after filtration is a water-clear potassium sulfate solution.

We claim:

1. A process for improving the solderability of a circuit board with conductor paths composed of copper, or copper alloy comprising the steps of
   A. first contacting conductor paths on a circuit board at least at areas to be soldered with a first solution for a time of from about 1 to 50 minutes, said first solution comprising on a 100 weight percent total weight basis;
       from about 2 to 20 weight percent of at least one dissolved non-ionic surfactant,
       from about 1 to 20 weight percent of at least one dissolved organic acid capable of producing a pH of not larger than 2 in water solution at a concentration of less than 50 grams per lite, and
       the balance up to 100 weight percent of any given such solution being water,
   B. first flushing the so first contacted areas with water for a period of time of at least about 12 seconds,
   C. secondly contacting the so first flushed areas with a second solution for a time of from about 2 to 10 minutes, said second solution comprising on a 100 weight percent total weight bases;
       from about 0.5 weight percent up to solution saturation of dissolved potassium persulfate
       sufficient added sulfuric acid to produce therein a pH of from about 1 to 4,
       from and including 0 up to about 0.5 weight percent dissolved phosphoric acid, and
       the balance up to 100 weight percent of any given such solution being water,
   D. secondly flushing the so secondly contacted areas with water for a period of time of at least about 10 seconds,
   E. thirdly contacting the so secondly flushed areas with a said first solution for a time of from about 1 to 5 minutes,
   F. thirdly flushing the so thirdly contacted areas with water for a period of time of at least about 10 seconds, and
   G. drying the so thirdly flushed areas in air.

2. The process of claim 1 wherein said non-ionic surfactant is ethoxylated.

3. The process of claim 2 wherein said surfactant is selected from the group consisting of alkyl ethoxylates, ethoxylated alklyl phenols, fatty acid ethanol amides, and polymers of ethylene oxide, propylene oxide, and alcohols, said surfactant containing from 2 to 40 moles of ethylene oxide per molecule.

4. The process of claim 3 wherein said surfactant is an ethoxylated alkyl phenol.

5. The process of claim 1 wherein said organic acid is a lower alkanoic acid.

6. The process of claim 5 wherein said lower alkanoic acid is formic acid.

7. The process of claim 1 wherein said non-ionic surfactant is an ethoxylated alkyl phenol having a degree of ethoxylation of from about 8 to 14 employed at a concentration of from about 20 to 100 grams per liter and said organic acid is formic acid employed at a concentration of from about 15 to 80 grams per liter, the quantity of said organic acid being used being at least sufficient to produce a pH of about 2, said first solution having a starting density of about 1.004 grams per cubic centimeter.

8. The process of claim 1 wherein said second solution has a pH of about 2 and a starting density of about 1.033 grams per cubic centimeter.

* * * * *